(12) United States Patent
Tetrick et al.

(10) Patent No.: US 8,386,701 B2
(45) Date of Patent: *Feb. 26, 2013

(54) APPARATUS AND METHOD FOR MULTI-LEVEL CACHE UTILIZATION

(75) Inventors: Raymond Scott Tetrick, Portland, OR (US); Dale Juenemann, North Plains, OR (US); Robert Brennan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/450,882

(22) Filed: Apr. 19, 2012

(65) Prior Publication Data

US 2012/0203960 A1 Aug. 9, 2012

Related U.S. Application Data

(63) Continuation of application No. 12/215,762, filed on Jun. 30, 2008, now Pat. No. 8,166,229.

(51) Int. Cl.
G06F 12/00 (2006.01)

(52) U.S. Cl. ............ 711/103; 711/100; 711/1; 711/102; 711/113; 711/118; 711/119; 711/122; 711/126; 711/137

(58) Field of Classification Search ................ 711/1, 36, 711/103, 113, 118, 119, 122, 126, 137
See application file for complete search history.

(56) References Cited

U.S. PATENT DOCUMENTS

| 5,519,831 | A | 5/1996 | Holzhammer |
|---|---|---|---|
| 5,673,388 | A | 9/1997 | Murthi et al. |
| 5,682,512 | A | 10/1997 | Tetrick |
| 6,003,112 | A | 12/1999 | Tetrick |
| 6,272,597 | B1 | 8/2001 | Fu et al. |
| 6,349,363 | B2 | 2/2002 | Cai et al. |
| 6,598,199 | B2 | 7/2003 | Tetrick |
| 6,622,212 | B1 | 9/2003 | Tetrick |
| 6,725,342 | B1 | 4/2004 | Coulson |
| 6,941,423 | B2 | 9/2005 | Coulson |
| 7,089,399 | B2 | 8/2006 | Tetrick |
| 7,127,571 | B2 | 10/2006 | Grover et al. |
| 7,231,470 | B2 | 6/2007 | Huggahalli et al. |
| 7,260,686 | B2 * | 8/2007 | Hakura et al. ................ 711/137 |
| 7,275,135 | B2 | 9/2007 | Coulson |

(Continued)

FOREIGN PATENT DOCUMENTS

| CN | 101981555 | 2/2011 |
|---|---|---|
| DE | 112009000431 T5 | 1/2011 |

(Continued)

OTHER PUBLICATIONS

International Preliminary Report on Patentability received for PCT application No. PCT/US2009/048386, mailed on Jan. 13, 2011, 5 pages.

(Continued)

*Primary Examiner* — Tuan Thai
*Assistant Examiner* — Zhuo Li
(74) *Attorney, Agent, or Firm* — Jordan IP Law, LLC

(57) ABSTRACT

In some embodiments, a non-volatile cache memory may include a multi-level non-volatile cache memory configured to be located between a system memory and a mass storage device of an electronic system and a controller coupled to the multi-level non-volatile cache memory, wherein the controller is configured to control utilization of the multi-level non-volatile cache memory. Other embodiments are disclosed and claimed.

9 Claims, 5 Drawing Sheets

U.S. PATENT DOCUMENTS

| | | | |
|---|---|---|---|
| 8,051,232 | B2 | 11/2011 | Dees et al. |
| 8,127,294 | B2 | 2/2012 | Tetrick |
| 8,166,229 | B2 * | 4/2012 | Tetrick et al. ................. 711/103 |
| 2004/0225840 | A1 | 11/2004 | O'Connor et al. |
| 2005/0144389 | A1 * | 6/2005 | Trika et al. .................... 711/129 |
| 2007/0005877 | A1 | 1/2007 | Tetrick |
| 2007/0214307 | A1 | 9/2007 | Huggahalli et al. |
| 2008/0022051 | A1 | 1/2008 | Osanai et al. |
| 2008/0147968 | A1 | 6/2008 | Lee et al. |
| 2009/0070526 | A1 | 3/2009 | Tetrick et al. |
| 2009/0144347 | A1 | 6/2009 | Boyd et al. |

FOREIGN PATENT DOCUMENTS

| | | |
|---|---|---|
| EP | 0 702 305 | 3/1996 |
| WO | 2010/002647 A3 | 3/2010 |

OTHER PUBLICATIONS

International Search Report and Written Opinion received for PCT application No. PCT/US2009/048386, mailed on Jan. 29, 2010, 11 pages.

"Windows PC Accelerators", Nov. 30, 2006.

White Paper, "Intel NAND Flash Memory for Intel Turbo Memory", 2007.

Messmer, Hans-Peter, "PC—Hardwarebuch,"Addison-Wesley-Longman, 1998, 3 pages.

Office Action received from United Kingdom Application GB 1015977.0, mailed on Mar. 7, 2012. 3 pages.

Office Action received from German Application 112000900431.8, mailed on Apr. 5, 2011. 3 pages.

* cited by examiner

APPARATUS AND METHOD FOR MULTI-LEVEL CACHE UTILIZATION

The invention relates to cache utilization. More particularly, some embodiments of the invention relate to an apparatus and method for utilizing a multi-level non-volatile cache in an electronic system such as a processor-based system.

BACKGROUND AND RELATED ART

Many electronic systems benefit from the use of cache memory. In some electronic systems, driver software may be provided to utilize cache memories.

In a white paper published at ftp://download.intel.com/design/flash/NAND/turbomemory/whitepaper.pdf, a white paper describes Intel® Turbo Memory as consisting of an Intel Turbo Memory controller ASIC (Application Specific Integrated Circuit) chip and two Intel NAND flash non-volatile memory components that enable faster resume to productivity after hibernate, providing additional power savings by limiting hard disk drive accesses and increasing application responsiveness for a richer user experience.

BRIEF DESCRIPTION OF THE DRAWINGS

Various features of the invention will be apparent from the following description of preferred embodiments as illustrated in the accompanying drawings, in which like reference numerals generally refer to the same parts throughout the drawings. The drawings are not necessarily to scale, the emphasis instead being placed upon illustrating the principles of the invention.

DESCRIPTION

In the following description, for purposes of explanation and not limitation, specific details are set forth such as particular structures, architectures, interfaces, techniques, etc. in order to provide a thorough understanding of the various aspects of the invention. However, it will be apparent to those skilled in the art having the benefit of the present disclosure that the various aspects of the invention may be practiced in other examples that depart from these specific details. In certain instances, descriptions of well known devices, circuits, and methods are omitted so as not to obscure the description of the present invention with unnecessary detail.

Figure 1:
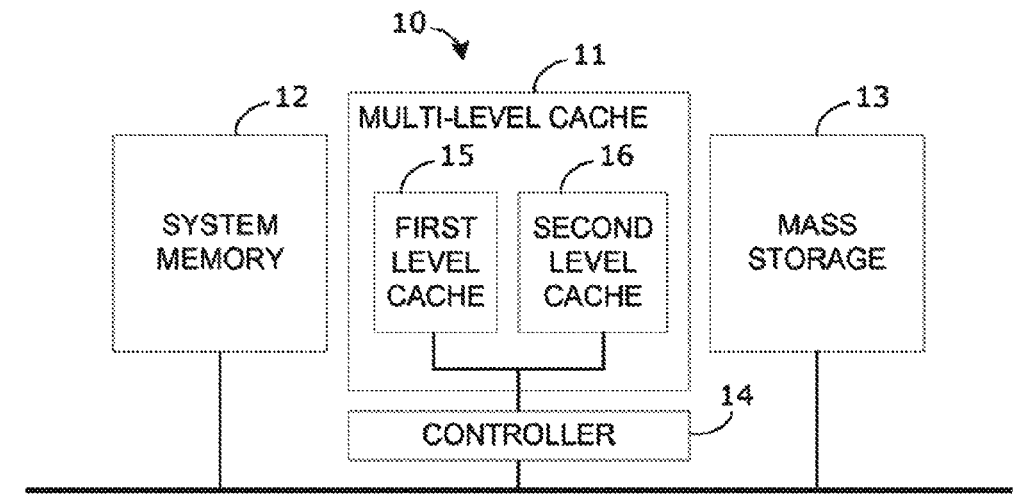
FIG. 1 is a block diagram of an electronic system in accordance with some embodiments of the invention.

With reference to FIG. 1, a non-volatile cache memory 10 may include a multi-level non-volatile cache memory 11 located between a system memory 12 and a mass storage device 13 of an electronic system, and a controller 14 coupled to the multi-level non-volatile cache memory 11, wherein the controller 14 may be configured to control utilization of the multi-level non-volatile cache memory 11. For example, the multi-level non-volatile cache memory 11 may include a first level non-volatile cache memory 15, the first level non-volatile cache memory 15 having a first set of operating characteristics, and a second level non-volatile cache memory 16, the second level non-volatile cache memory 16 having a second set of operating characteristics, wherein the second set of operating characteristics are different from the first set of operating characteristics. For example, the controller may be configured to utilize the first level non-volatile cache memory 15 differently from the second level non-volatile cache memory 16 in accordance with the respective first and second set of operating characteristics.

In some embodiments of the cache memory 10, for example, the first level non-volatile cache memory 15 may include relatively faster cache memory as compared to the second level non-volatile cache memory 16. In some embodiments of the cache memory 10, for example, the second level non-volatile cache memory 16 may include relatively higher storage density cache memory as compared to the first level non-volatile cache memory 15. For example, the first level non-volatile cache memory 15 may include single level cell (SLC) NAND flash memory and the second level non-volatile cache memory 16 may include multi-level cell (MLC) NAND flash memory.

For example, in some embodiments of the cache memory 10, the controller 14 may be configured to implement a first cache insertion policy for the first level non-volatile cache memory 15 and a second cache insertion policy for the second level non-volatile cache memory 16, wherein the first cache insertion policy is different from the second cache insertion policy. For example, controller 14 may be further configured to receive a request for mass storage access, the request requesting information to be accessed on the mass storage device 13, and to cache the information in one of the first level non-volatile cache memory 15 and the second level non-volatile cache memory 16 in accordance with the respective first and second cache insertion policies. The mass storage access may correspond to either a read access or a write access. For example, the controller 14 may be an integrated part of a non-volatile cache memory device or may be located elsewhere in the electronic system and coupled to the multi-level non-volatile cache memory 11 by a bus or other electronic connection.

Figure 2:
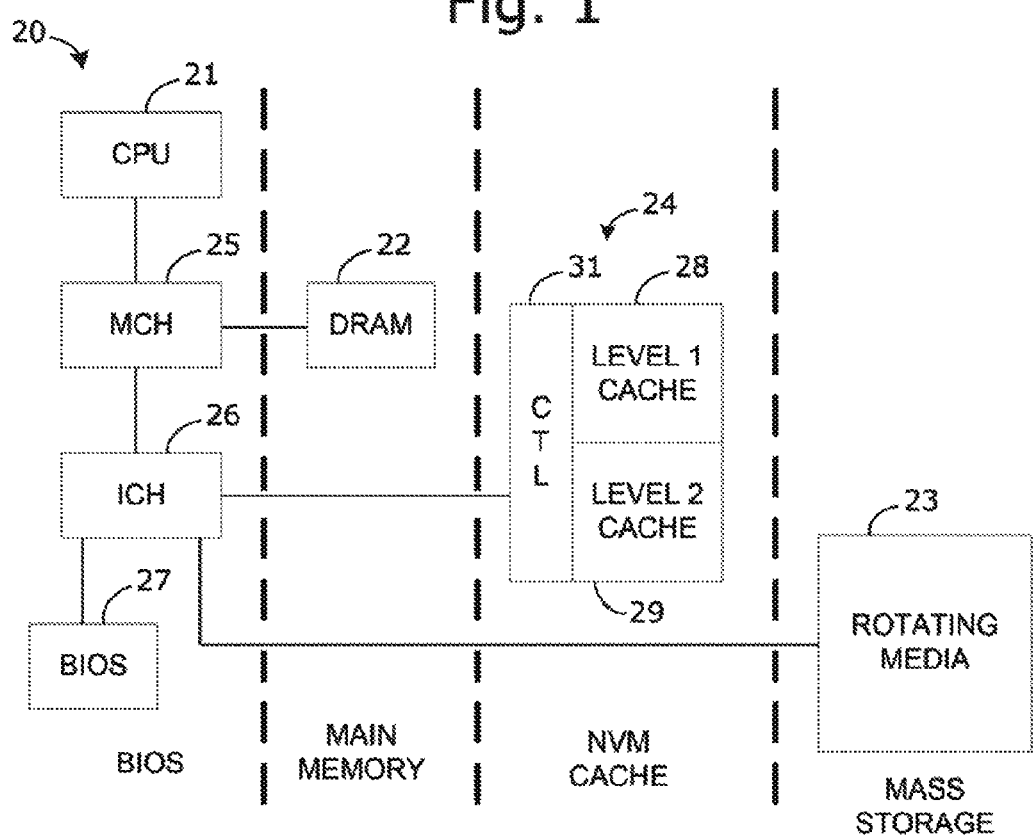
FIG. 2 is a block diagram of a processor-based system in accordance with some embodiments of the invention.

With reference to FIG. 2, a processor-based system 20 may include a processor 21, a system memory 22 coupled to the processor 21, a mass storage device 23, and a multi-level non-volatile cache memory (NVM) 24 located between the system memory 22 and the mass storage device 23. For example, the processor 21 may be a central processing unit (CPU). For example, the system memory 22 may be a dynamic random access memory (DRAM). For example, the system memory 22 may be coupled to the processor 21 via a memory controller hub (MCH) 25. For example, the mass storage device 23 may be a rotating media such as a hard disk drive or an optical disk drive. For example, the mass storage device 23 may be a non-rotating media such as a solid-state drive. For example, both the cache 24 and the mass storage device 23 may be coupled to the MCH via an input/output controller hub (ICH) 26.

The processor-based system 20 may further include code stored on the processor-based system 20 to cause the processor-based system to utilize the multi-level non-volatile cache memory 24. For example, the code may be stored on the mass storage device 23, the system memory 22, or another memory or storage device coupled to the processor-based system 20. For example, the code may be stored as part of a basic input/output system (BIOS) 27 coupled to the ICH 26.

In some embodiments of the processor-based system 20, the multi-level non-volatile cache memory 24 may include a first level non-volatile cache memory 28, the first level non-volatile cache memory 28 having a first set of operating characteristics, and a second level non-volatile cache memory 29, the second level non-volatile cache memory 29 having a second set of operating characteristics, wherein the second set of operating characteristics are different from the first set of operating characteristics. For example, the code may be configured to cause the processor-based system to utilize the first level non-volatile cache memory 28 differently from the second level non-volatile cache memory 29 in accordance with the respective first and second set of operating characteristics.

For example, in some embodiments of the processor-based system 20, the first level non-volatile cache memory 28 may include relatively faster cache memory as compared to the second level non-volatile cache memory 29. For example, the second level non-volatile cache memory 29 may include relatively higher storage density cache memory as compared to the first level non-volatile cache memory 28. For example, the first level non-volatile cache memory 28 may include SLC NAND flash memory and the second level non-volatile cache memory 29 may include MLC NAND flash memory.

For example, in some embodiments of the processor-based system 20, the code may be configured to cause the processor-based system to implement a first cache insertion policy for the first level non-volatile cache memory 28 and a second cache insertion policy for the second level non-volatile cache memory 29, wherein the first cache insertion policy is different from the second cache insertion policy. For example, the code may be further configured to cause the processor-based system to receive a request for mass storage access, the request requesting information to be accessed on the mass storage device, and to cache the information in one of the first level non-volatile cache memory and the second level non-volatile cache memory in accordance with the respective first and second cache insertion policies. The mass storage access may correspond to either a read access or a write access.

Figure 3:
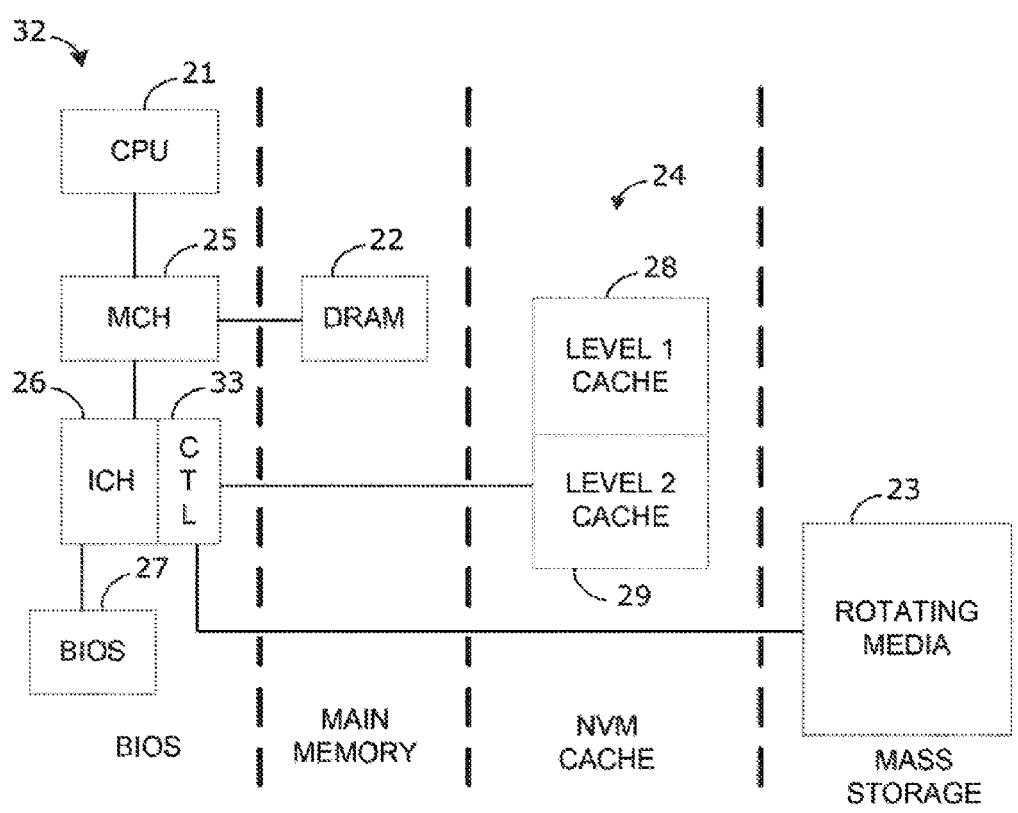
FIG. 3 is a block diagram of another processor-based system in accordance with some embodiments of the invention.

For example, in some embodiments of the processor-based system 20, all or a portion of the code may be implemented by or executed by a controller 31 which may be integrated with the multi-level non-volatile cache memory 24. Alternatively, with reference to FIG. 3, some embodiments of a processor-based system 32 may include a controller 33 located elsewhere in the processor-based system 32 and coupled to the multi-level non-volatile cache memory 24 by a bus or other electronic connection. For example, the controller 33 may be integrated with the ICH 26.

Figure 4:
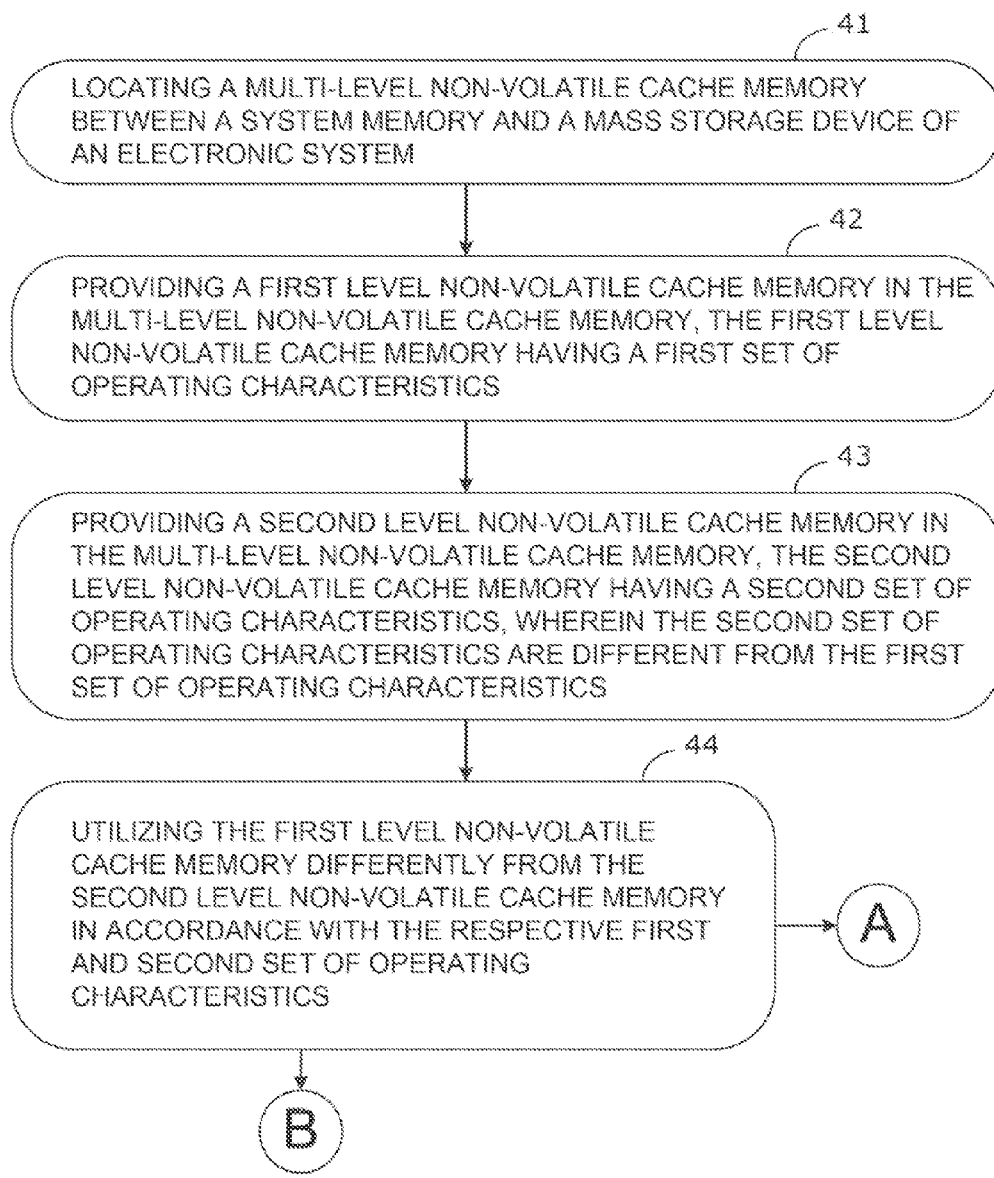
FIG. 4 is a flow diagram in accordance with some embodiments of the invention.

With reference to FIG. 4, in accordance with some embodiments of the invention, utilizing a non-volatile cache memory may include locating a multi-level non-volatile cache memory between a system memory and a mass storage device of an electronic system (e.g. block 41), providing a first level non-volatile cache memory in the multi-level non-volatile cache memory, the first level non-volatile cache memory having a first set of operating characteristics (e.g. block 42), providing a second level non-volatile cache memory in the multi-level non-volatile cache memory, the second level non-volatile cache memory having a second set of operating characteristics, wherein the second set of operating characteristics are different from the first set of operating characteristics (e.g. block 43), and utilizing the first level non-volatile cache memory differently from the second level non-volatile cache memory in accordance with the respective first and second set of operating characteristics (e.g. block 44).

Figure 5:
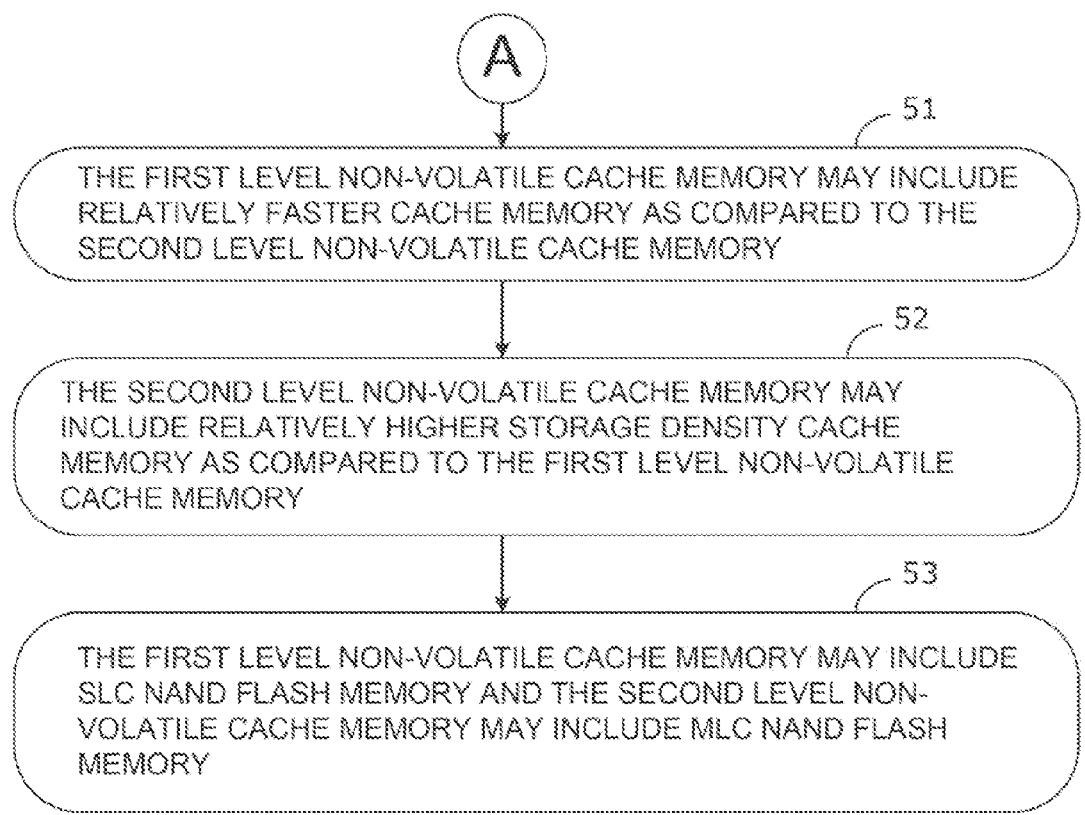
FIG. 5 is another flow diagram in accordance with some embodiments of the invention.

With reference to FIG. 5, in some embodiments of the invention, for example, the first level non-volatile cache memory may include relatively faster cache memory as compared to the second level non-volatile cache memory (e.g. block 51). For example, the second level non-volatile cache memory may include relatively higher storage density cache memory as compared to the first level non-volatile cache memory (e.g. block 52). For example, the first level non-volatile cache memory may include SLC NAND flash memory and the second level non-volatile cache memory may include MLC NAND flash memory (e.g. block 53).

Figure 6:
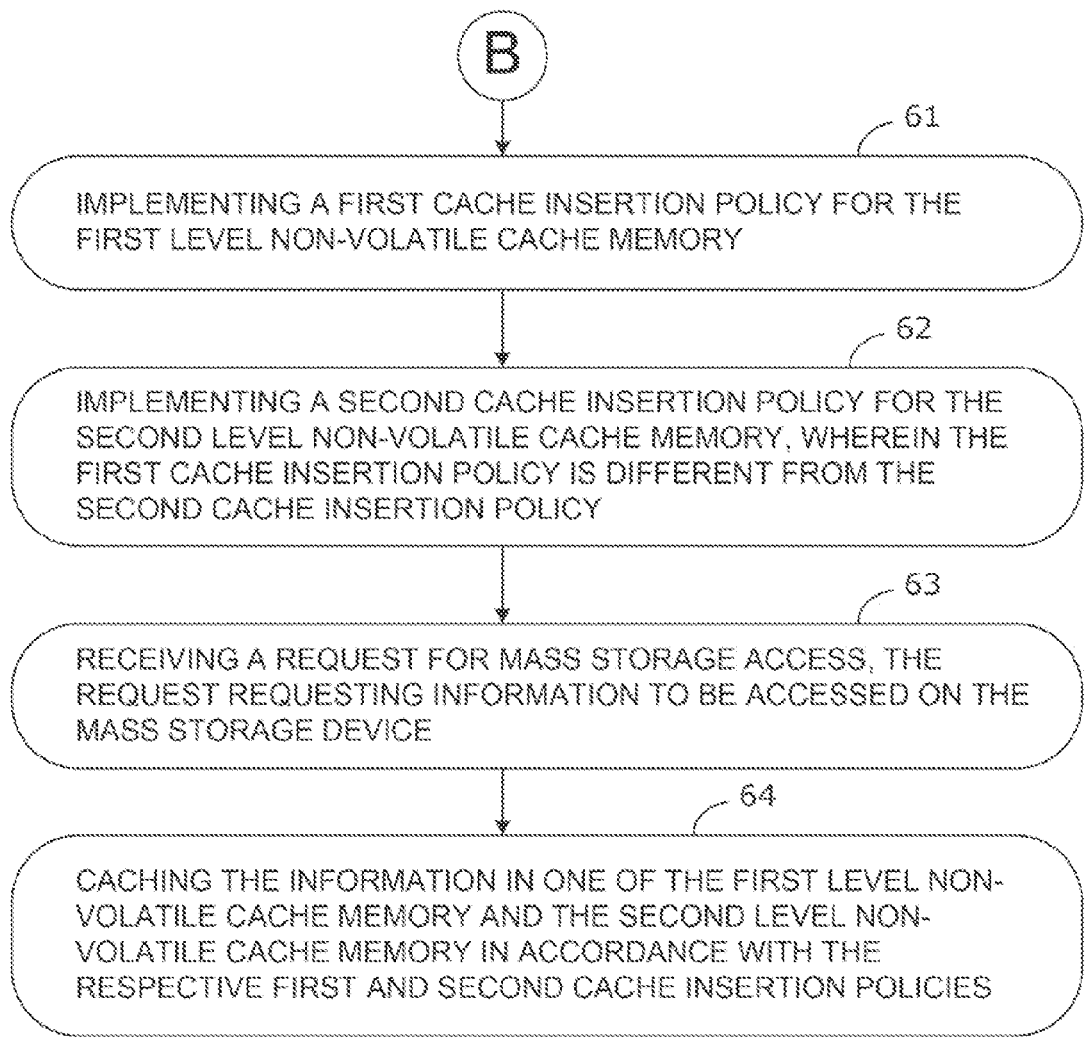
FIG. 6 is another flow diagram in accordance with some embodiments of the invention.

With reference to FIG. 6, some embodiments of the invention may further include implementing a first cache insertion policy for the first level non-volatile cache memory (e.g. block 61), and implementing a second cache insertion policy for the second level non-volatile cache memory, wherein the first cache insertion policy is different from the second cache insertion policy (e.g. block 62). Some embodiments of the invention may further include receiving a request for mass storage access, the request requesting information to be accessed on the mass storage device (e.g. block 63), and caching the information in one of the first level non-volatile cache memory and the second level non-volatile cache memory in accordance with the respective first and second cache insertion policies (e.g. block 64). The mass storage access may correspond to either a read access or a write access.

Advantageously, some embodiments of the invention may provide a multi-level, non-volatile I/O caching hierarchy in a system which may use management algorithms tuned to the specific type of non-volatile storage technology being used. In some embodiments of the invention, a system may be able to utilize a larger cache with multiple types of non-volatile memory. For example, level one cache might be implemented with relatively fast SLC NAND flash or other fast non-volatile memory technology, and the level two cache may be implemented in relatively slower, but denser MLC NAND flash. Advantageously, a two or more layer cache hierarchy may allow for a higher performing, lower power and/or more cost effective I/O caching solution.

For example, some embodiments of the invention may provide multi-level I/O caching based on non-volatile devices using progressively faster speeds, as well as using cache management algorithms specifically tuned to the differing characteristics of the underlying non-volatile memory devices. For example, in a two level cache system, caching algorithms may be tuned differently for the first and second level cache. For example, if the second level cache was implemented with MLC NAND flash memory, these devices have a set of operating characteristics which are different from the operating characteristics of SLC NAND flash memory. By way of comparison, for example, MLC read speeds may be about 75% of SLC read speeds, MLC write speeds may be about 25% of SLC write speeds, and MLC write wearout characteristics may be about ten times worse than SLC write wearout characteristics. However, MLC NAND flash memory may provide about twice as much storage capacity for same die area as compared to SLC NAND flash memory, and therefore MLC may be roughly 30%-50% cheaper per bit than SLC.

For example, a cache insertion policy for the first level cache may give preference to smaller, less frequently used information. However, a relatively more discriminating cache insertion policy may be preferred for the second level cache to minimize the number of writes to the MLC cache array. For example, a cache insertion policy for the second level cache may include a relatively higher frequency threshold and/or a relatively higher minimum size threshold, as compared to the first level cache insertion policy, to give preference to larger, more frequently used information.

Those skilled in the art will appreciate that, given the benefit of the present description, a numerous variety of other circuits and combinations of hardware and/or software may be configured to implement various methods, circuits, and systems in accordance with the embodiments described herein and other embodiments of the invention. The examples of FIGS. 1 through 6 are non-limiting examples of suitable embodiments.

The foregoing and other aspects of the invention are achieved individually and in combination. The invention should not be construed as requiring two or more of such aspects unless expressly required by a particular claim. Moreover, while the invention has been described in connection with what is presently considered to be the preferred examples, it is to be understood that the invention is not limited to the disclosed examples, but on the contrary, is intended to cover various modifications and equivalent arrangements included within the spirit and the scope of the invention.

What is claimed is:

1. A processor-based system, comprising:
   a processor;
   a system memory coupled to the processor;
   a mass storage device;
   a multi-level non-volatile cache memory located between the system memory and the mass storage device, wherein the multi-level non-volatile cache memory includes a plurality of non-volatile cache memories, wherein each non-volatile cache memory of the plurality of non-volatile cache memories has an operating characteristic, wherein the operating characteristics among the plurality of non-volatile cache memories are different and wherein each non-volatile cache memory of the plurality of non-volatile cache memories has a cache insertion policy based on its operating characteristic, and wherein the cache insertion policies among the plurality of non-volatile cache memories are different; and
   code stored on the processor-based system to cause the processor-based system to, in response to a request for access to information on the mass storage device, cache the information in one of the plurality of non-volatile cache memories in accordance with the plurality of cache insertion policies.

2. The system of claim 1, wherein the plurality of non-volatile cache memories have different speeds.

3. The system of claim 1, wherein the plurality of non-volatile cache memories have different storage densities.

4. A storage system comprising:
   a system memory;
   a mass storage device;
   a multi-level non-volatile cache memory located between the system memory and the mass storage device, wherein the multi-level non-volatile cache memory includes a plurality of non-volatile cache memories, wherein each non-volatile cache memory has an operating characteristic, and wherein the operating characteristics among the plurality of non-volatile cache memories are different; and
   a controller coupled to the multi-level non-volatile cache memory, wherein the controller is configured to control utilization of the multi-level non-volatile cache memory in accordance with the operating characteristics of the plurality of non-volatile cache memories,
   wherein each non-volatile cache memory of the plurality of non-volatile cache memories has a cache insertion policy, wherein the cache insertion policies among the plurality of non-volatile cache memories are different, and wherein the controller is configured to implement the cache insertion policies.

5. The storage system of claim 4, wherein the plurality of non-volatile cache memories have different speeds.

6. The system of claim 4, wherein the plurality of non-volatile cache memories have different storage densities.

7. A computer-implemented method of utilizing a multi-level non-volatile cache memory, the method comprising:
   receiving a request for access to information on a mass storage device;
   caching the information in one of a plurality of non-volatile cache memories of a multi-level non-volatile cache memory, wherein each non-volatile cache memory of the multi-level non-volatile cache memory has an operating characteristic, wherein the operating characteristics among the plurality of non-volatile cache memories of multi-level non-volatile cache memory are different, wherein each non-volatile cache memory has a cache insertion policy based on its operating characteristic, and wherein the cache insertion policies among the plurality of non-volatile cache memories are different wherein the caching is in accordance with a plurality of cache insertion policies.

8. The computer-implemented method of claim 7, wherein the plurality of non-volatile cache memories have different speeds.

9. The computer-implemented method of claim 7, wherein the plurality of non-volatile cache memories have different storage densities.

\* \* \* \* \*